| | | |
|---|---|---|
| (12) | United States Patent<br>Tennyson et al. | (10) Patent No.: US 11,768,254 B1<br>(45) Date of Patent: Sep. 26, 2023 |

(54) APPARATUS FOR DETECTION OF PACKET ENERGY TRANSFER IN CABLES AND RELATED METHODS

(71) Applicant: Telco Sales, Inc., Pelham, AL (US)

(72) Inventors: Gary J. Tennyson, Birmingham, AL (US); Floyd D. Rohner, Vestavia Hills, AL (US)

(73) Assignee: Telco Sales, Inc., Pelham, AL (US)

( * ) Notice: Subject to any disclaimer, the term of this patent is extended or adjusted under 35 U.S.C. 154(b) by 0 days.

(21) Appl. No.: 17/975,215

(22) Filed: Oct. 27, 2022

Related U.S. Application Data

(60) Provisional application No. 63/282,339, filed on Nov. 23, 2021.

(51) Int. Cl.
```
G01R 31/58      (2020.01)
H04B 3/02       (2006.01)
H04L 12/10      (2006.01)
H04B 3/54       (2006.01)
```

(52) U.S. Cl.
CPC .............. *G01R 31/58* (2020.01); *H04B 3/02* (2013.01); *H04B 3/54* (2013.01); *H04L 12/10* (2013.01); *H04B 3/548* (2013.01)

(58) Field of Classification Search
CPC . G01R 31/58; H04B 3/02; H04B 3/54; H04B 3/548; H04L 12/10
See application file for complete search history.

(56) References Cited

U.S. PATENT DOCUMENTS

| 8,068,937 B2 * | 11/2011 | Eaves | ........................ | H02H 3/30<br>307/62 |
| 2016/0134331 A1 * | 5/2016 | Eaves | ...................... | H04B 3/548<br>307/1 |

OTHER PUBLICATIONS

Eaves, Stephen S.; Network Remote Powering Using Packet Energy Transfer, 2012, 4 pages, VoltServer, Inc., Charlestown, RI, US. (Year: 2012).

* cited by examiner

*Primary Examiner* — Amy He
(74) *Attorney, Agent, or Firm* — Taylor English Duma LLP

(57) ABSTRACT

An apparatus for detecting Packet Energy Transfer (PET) in a cable is disclosed herein. The PET detecting apparatus includes an input adapted to generate a current by operative communication of the input with the cable, wherein the cable communicates PET as a pulse train. A spectral analyzer compares frequencies of maxima of the power spectrum of a signal derived from the current with a fundamental frequency of the pulse train and a harmonic frequency of the pulse train to detect PET in the cable. A power maximum of the power spectrum at the fundamental frequency and a second power maximum of the power spectrum at the harmonic frequency indicates PET in the cable. No power maximum of the power spectrum at the fundamental frequency or no second power maximum of the power spectrum at the harmonic frequency indicates no PET in the cable.

20 Claims, 6 Drawing Sheets

APPARATUS FOR DETECTION OF PACKET ENERGY TRANSFER IN CABLES AND RELATED METHODS

CROSS-REFERENCE TO RELATED APPLICATIONS

This application claims priority and benefit of U.S. Provisional Application No. 63/282,339, filed Nov. 23, 2021, which is hereby incorporated by reference in its entirety herein.

FIELD OF THE INVENTION

This disclosure relates to detectors for electrical systems, and, more particularly, to apparatus and related methods for detection of the presence (or absence) of Packet Energy Transfer (PET) in a cable.

BACKGROUND OF THE INVENTION

Packet Energy Transfer (PET), otherwise known as digital power, may be used to deliver power to equipment over cables that may normally transport data. PET may be thought of as a type of pulsed DC power. In PET, power is digitized by being separated into packets with a portion of each packet being used for energy transmission and a remainder of each packet being used for data transfer. The data transfer portion of the packet may be used, at least in part, for fault discovery.

PET may have a wide variety of applications in various systems. For example, PET may be deployed with telecommunications equipment in telecommunication systems to power equipment in 4G, 5G networks. Digital Subscriber Line Access Multiplexers (DSLAMs), for example, may be powered by PET over twisted pair from a central location. PET, for example, may be deployed to deliver power to equipment in computer systems and System Control and Data Acquisition (SCADA) systems.

It is sometimes necessary in the various systems in which PET may be deployed to service a section of cable or a cable terminal, for example. The delivery of PET is interrupted during servicing thereby impacting operations of the system. It is desirable that such interruptions be minimized in order to minimize impacts on operations of the system. Accordingly, there is a need for improved apparatus as well as related methods for detection of PET in a cable.

BRIEF SUMMARY OF THE INVENTION

These and other needs and disadvantages may be overcome by the apparatus and related methods disclosed herein. Additional improvements and advantages may be recognized by those of ordinary skill in the art upon study of the present disclosure.

A Packet Energy Transfer (PET) detector apparatus for detecting PET in a cable is disclosed herein. In various aspects, the PET detector includes an input adapted to generate a current by operative communication of the input with the cable, wherein the cable communicates PET as a pulse train. The PET detector apparatus includes an A/D converter in communication with the input to form a digital representation of at least portions of the current, in various aspects. The PET detector apparatus includes an FFT (Fast Fourier Transform) to transform the digital representation into a power spectrum, the FFT in communication with the A/D converter, in various aspects. In various aspects, the PET detector apparatus includes a spectral analyzer to compare frequencies of maxima of the power spectrum with a fundamental frequency $f_1$ of the pulse train and a harmonic frequency $f_2$ of the pulse train to detect PET in the cable, the spectral analyzer in communication with the FFT. A power maximum $P_1$ of the power spectrum at the fundamental frequency $f_1$ and a second power maximum $P_2$ of the power spectrum at the harmonic frequency $f_2$ indicates PET in the cable. No power maximum $P_1$ of the power spectrum at the fundamental frequency $f_1$ or no second power maximum $P_2$ of the power spectrum at the harmonic frequency $f_2$ indicates no PET in the cable, in various aspects. In certain aspects, the presence of power maximum $P_1$ of the power spectrum at the fundamental frequency $f_1$ may be sufficient to indicate PET in the cable.

Related methods of detecting PET in a cable are also disclosed herein. In various aspects, the methods of detecting PET in a cable include the step of generating a current in an input of a PET detector apparatus by placing the input in operable communication with a cable, the cable communicating PET configured as a pulse train having a fundamental frequency $f_1$ and a harmonic frequency $f_2$. In various aspects, the methods of detecting PET in a cable include the step of forming a digital representation of at least portions of the current using an A/D converter communicating with the input, and the step of transforming the digital representation into a power spectrum using an FFT, the FFT communicating with the A/D converter. In various aspects, the methods of detecting PET in a cable include the step of detecting PET in the cable by finding a power maximum $P_1$ at the fundamental frequency $f_1$ and finding a power maximum $P_2$ at the harmonic frequency $f_2$.

This summary is presented to provide a basic understanding of some aspects of the apparatus and methods disclosed herein as a prelude to the detailed description that follows below. Accordingly, this summary is not intended to identify key elements of the apparatus and methods disclosed herein or to delineate the scope thereof.

Figure 1:
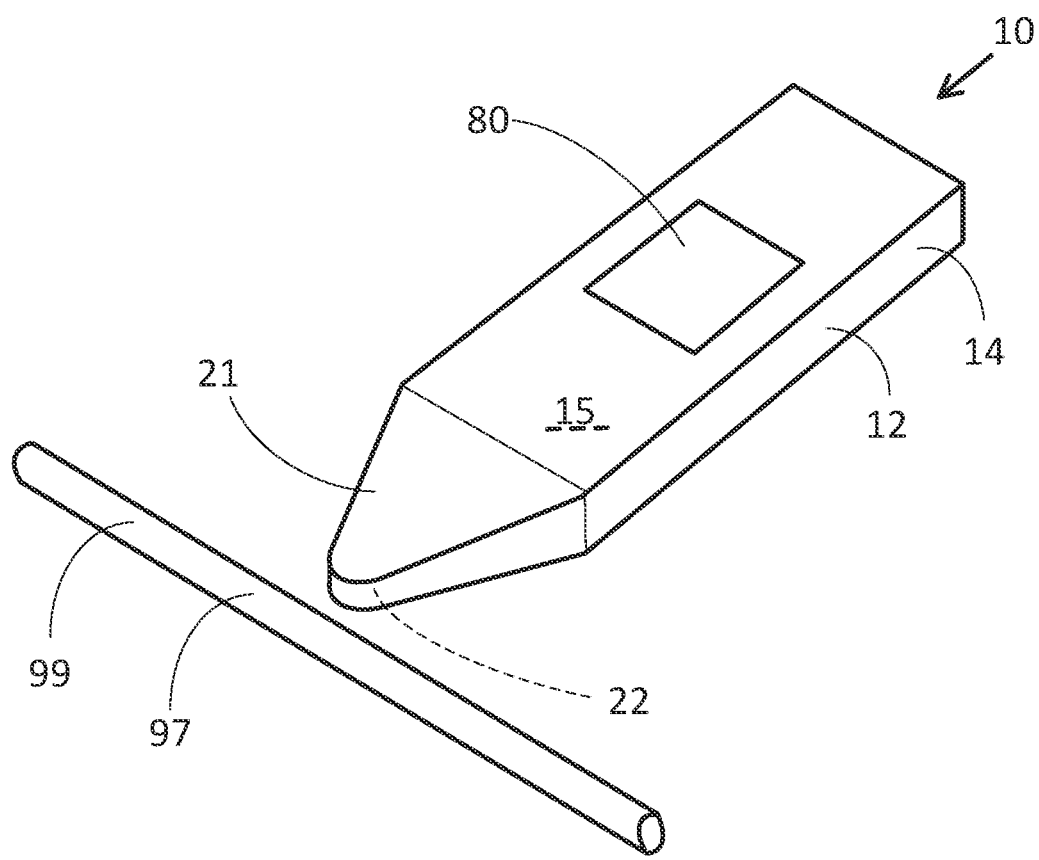
FIG. 1 illustrates by perspective view an exemplary implementation of a PET detector apparatus and PET detection system according to aspects of the present inventions.

The Figures are exemplary only, and the implementations illustrated therein are selected to facilitate explanation. For example, the components of various apparatus illustrated in the Figures may be selected for explanatory purposes, and the components may be grouped in the Figures in various ways to facilitate description, so that the apparatus may include various other components or the components may be grouped in various other ways, in other implementations. The process steps of the various processes illustrated in the Figures may be performed, for example, in other orders or the process steps may be grouped, divided, or subdivided in various ways, in other implementations. Information flows and process flows in the Figures included herein are indicated by arrows, and it should be understood that additional information flows and process flows may occur between various components and that other information flows and process flows may occur, in various other implementations. The number, position, relationship and dimensions of the elements shown in the Figures to form the various implementations described herein, as well as dimensions and dimensional proportions to conform to specific force, weight, strength, flow and similar requirements are explained herein or are understandable to a person of ordinary skill in the art upon study of this disclosure. Where used in the various Figures, the same numerals designate the same or similar elements. Furthermore, when the terms "top," "bottom," "right," "left," "forward," "rear," "first," "second," "inside," "outside," and similar terms are used, the terms should be understood in reference to the orientation of the implementations shown in the drawings and are utilized to facilitate description thereof. Use herein of relative terms such as generally, about, approximately, essentially, may be indicative of engineering, manufacturing, or scientific tolerances such as ±0.1%, ±1%, ±2.5%, ±5%, or other such tolerances, as would be recognized by those of ordinary skill in the art upon study of this disclosure.

DETAILED DESCRIPTION OF THE INVENTION

Disclosed herein are Packet Energy Transfer (PET) detection systems including a PET detector apparatus for detecting PET in a cable by detecting the presence or absence of a pulse train in the cable, in various aspects. The PET detector apparatus may be generally contained in a housing configured to be handheld in order to be utilized by a technician during servicing of electrical equipment. In various aspects, the PET detector apparatus includes an input that generates an internal current within the PET detector apparatus when the input is placed proximate the cable in operative communication with the cable and the cable is communicating PET.

PET comprises packets with each packet comprised of an energy packet and a data packet, in various aspects. In various aspects, the energy of the data packet may be ignored because the energy of the data packet is significantly less than the energy of the energy packet. In such aspects, PET is formed as a pulse train that is periodic and repetitive and has a rectangular waveform. The PET pulse train generates an internal current within the PET detector apparatus that comprises a corresponding pulse train with similar period and rectangular waveform, in various aspects. This corresponding pulse train within the PET detector apparatus gives rise to line spectra in the frequency domain having power maxima at a fundamental frequency of the pulse train and power maxima at harmonics of the fundamental frequency of the pulse train. Detection by the PET detector apparatus of the presence of power maxima in the power spectrum at the fundamental frequency and harmonics of the fundamental frequency of the pulse train indicates the presence of PET.

Apparatus disclosed herein may be implemented in hardware, operable software, and combinations thereof, in various aspects. Related methods are disclosed herein that may be implemented in hardware, operable software, and combinations thereof, in various aspects. Compositions of matter disclosed herein include non-transitory media that include computer readable instructions that, when executed, cause one or more computers to function as at least portions of the apparatus or to implement at least some of the steps of the methods. The computer readable instructions (e.g., software) may be configured, for example, as high-level code such as C or Java, as assembly language, machine code, or combinations thereof, and may be operably received by a processor. The processor includes electronic circuitry that executes the computer readable instructions. The processor, for example, may perform arithmetical operations (addition, subtraction, multiplication, division), logical operations, control operations, and I/O operations. A nominal representation of data may either be the data itself or a pointer, description, or other data that may be used to create the data.

FIG. 1 illustrates exemplary PET detection system 10 including PET detector apparatus 12 in operable communication with cable 99. Cable 99 is generally formed as an electrically conductive pathway, and cable 99 may include, for example, wire, coaxial cable, CAT6 (Ethernet) cable, twisted pair cable, waveguide, or other electrically conductive pathway(s) and combinations thereof. Cable 99 conveys PET 97, meaning electrical power is being communicated over cable 99 by PET 97, as illustrated in FIG. 1. PET 97 is comprised of packets, such as exemplary packet 91, illustrated in FIG. 2A, so that PET is communicated by pulse train 86, as illustrated in FIG. 2B. PET detector apparatus 12 detects the presence or absence of a pulse train, such as pulse train 86, in cable 99 thereby correspondingly detecting either the presence of PET or absence of PET, such as PET 97, respectively, in cable 99, in this implementation.

Figure 2A:
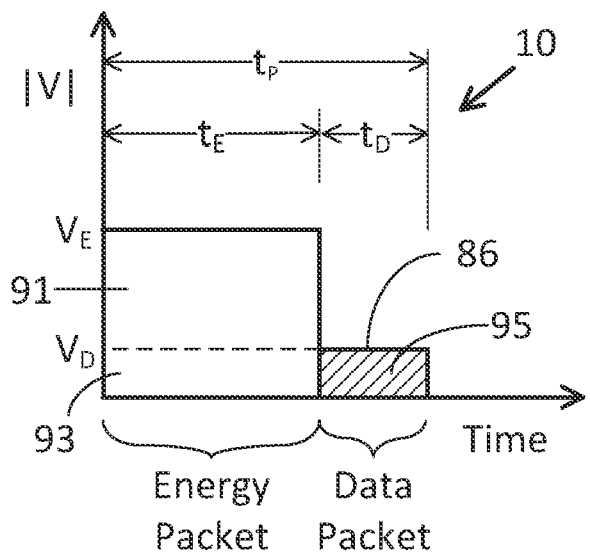
FIG. 2A illustrates by Cartesian plot features of the exemplary PET detector apparatus and PET detection system of FIG. 1.
Figure 2B:
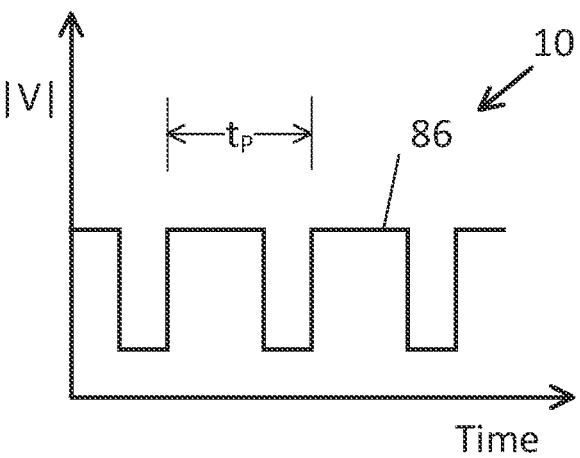
FIG. 2B illustrates by Cartesian plot features of the exemplary PET detector apparatus and PET detection system of FIG. 1.

Packet 91, as illustrated in FIG. 2A, has a packet period $t_P$, and packet 91 is comprised of energy packet 93 with voltage $v_E$ delivered for energy packet period $t_E$ and data packet 95 with voltage $v_D$ delivered for data packet period $t_D$. Energy packet 93 delivers electrical power and data packet 95 may be used, at least in part, for fault detection in cable 99 and associated equipment. Voltage $v_E$ is typically much greater than voltage $v_D$, and voltage $v_D$ may approach zero. The pulse train, such as pulse train 86, essentially has a rectangular waveform with fundamental frequency $f_P=1/t_P$ as voltage variations of data packet 95 associated with fault detection may be small. The pulse train, such as pulse train 86, may have other waveforms in other implementations of PET.

As an example, energy packet period $t_E$ may be about 1.1 ms, and data packet period $t_D$ may be about 0.4 ms resulting in packet 91 having packet period $t_P$ of about 1.5 ms and corresponding fundamental frequency $f_P$ of pulse train 86 of about 667 Hz. As an example, PET may communicate 100 w over CAT6 or 1,000 w over 4 pair cable. Voltage $v_E$ may be ±190 v over a pair, for example. Note that PET 97 including pulse train 86 and packet 91 is exemplary, and PET 97 may be configured in various other ways with various other waveform configurations (e.g., triangular, ramp) and packet configurations in various other implementations, as would be readily recognized by one of ordinary skill in the art upon study of this disclosure.

In the exemplary implementation of FIG. 1, PET detector apparatus 12 includes housing 14 with display 80 located on a surface of housing 14 to be visually accessible. Housing 14 includes housing extension 21 formed as a portion of housing 14 that extends forth from a remainder of housing 14, as illustrated. Although shown as rectangular for purposes of explanation, housing 14 may assume any desired shape, in various implementations. As it is contemplated that PET detector apparatus 12 may be handheld, portions of housing 14 may be shaped to facilitate gripping by a user, and housing 14 may include one or more handle(s), points of attachment, grippable surface(s), and so forth to allow manipulation. Housing 14 may be formed, at least in part, of hard plastic.

Figure 3:
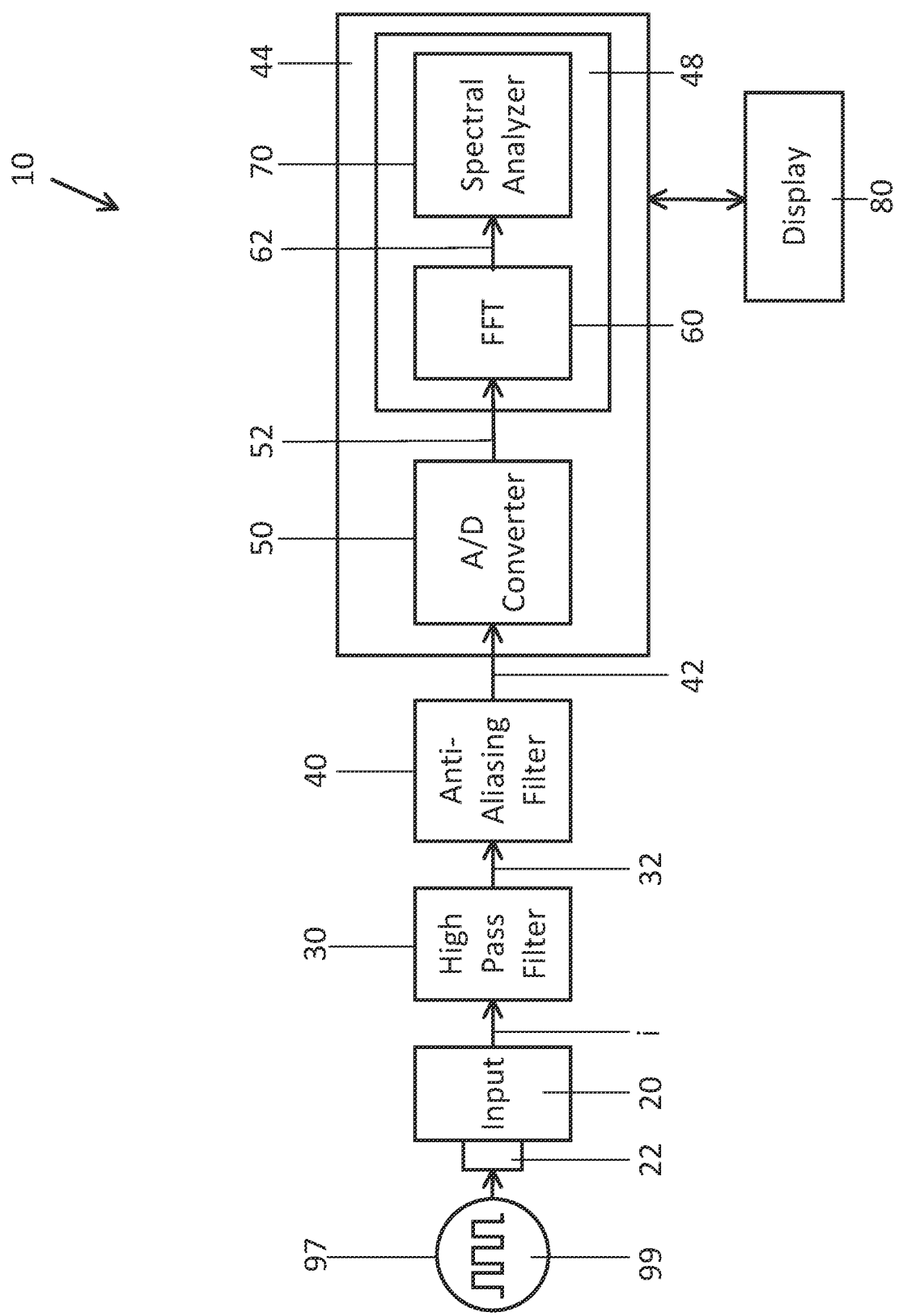
FIG. 3 illustrates by schematic diagram various exemplary components of the exemplary PET detector apparatus and PET detection system of FIG. 1.

As illustrated in FIG. 3, PET detector apparatus 12 comprises input 20, high-pass filter 30, anti-aliasing filter 40, A/D converter 50, FFT (Fast Fourier Transform) 60, spectral analyzer 70, and display 80 disposed about housing 14. Housing 14 defines chamber 15 within to contain at least portions of input 20, high-pass filter 30, anti-aliasing filter 40, A/D converter 50, FFT 60, spectral analyzer 70, and display 80, in this implementation. Although not included for clarity of explanation, PET detector apparatus may include, for example, a power source such as a battery, an ON/OFF switch, an illumination source, and so forth, as would be readily recognized by one of ordinary skill in the art upon study of this disclosure.

Input 20 includes probe 22, and at least portions of probe 22 are contained within portions of chamber 15 within housing extension 21, in this implementation. As illustrated in FIG. 1, housing extension 21 of input 20 is placed proximate cable 99 to place probe 22 of input 20 in operable communication with cable 99 to enable pulse train 86 comprised of packets, such as packet 91, to generate current i in input 20 thereby allowing PET detector apparatus 12 to detect PET 97 in cable 99. The illustration of housing extension 21 that contains portions of probe 22 within is presented for explanatory purposes. Accordingly, it should be understood that housing 14 including housing extension 21, input 20, and probe 22 of PET detector apparatus 12 may be configured in various other ways to operably communicate with cable 99, in various other implementations.

Display 80 may indicate either the presence or absence of PET, such as PET 97, as detected by detecting, respectively, the presence or absence of pulse train 86 in cable 99. Display 80 may include, for example, light(s), display screen, index hand on a dial, sound generator, and so forth, as would be readily recognized by those of ordinary skill in the art upon study of this disclosure. For example, display 80 may include a light that illuminates upon detection of PET 97 in cable 99 or a sound generator that beeps upon detection of PET 97 in cable 99. As another example, display 80 may include a display screen that displays the presence of or absence of PET, such as PET 97, in cable 99. Upon detection of PET, display 80 may display additional information related to PET such as packet period $t_P$ of packet 91, voltage $v_E$ of energy packet 93, voltage $v_D$ of data packet 95, energy packet period $t_E$ of energy packet 93, data packet period $t_D$ of data packet 95, and/or corresponding frequencies thereof. Display 80 may display the waveform, such as rectangular, ramp, triangular, of the PET detected.

As illustrated in FIG. 3, input 20, high-pass filter 30, anti-aliasing filter 40, A/D converter 50, FFT 60, spectral analyzer 70, and display 80 are in sequential communication with one another. Probe 22 of input 20 communicates operably with cable 99, and PET 97 in cable 99 generates current i in input 20 that flows from input 20 to high-pass filter 30, as illustrated in FIG. 3. PET 97 in cable 99 may generate current i in input 20 by induction or by capacitance between cable 99 and probe 22, in various implementations.

Figure 2C:
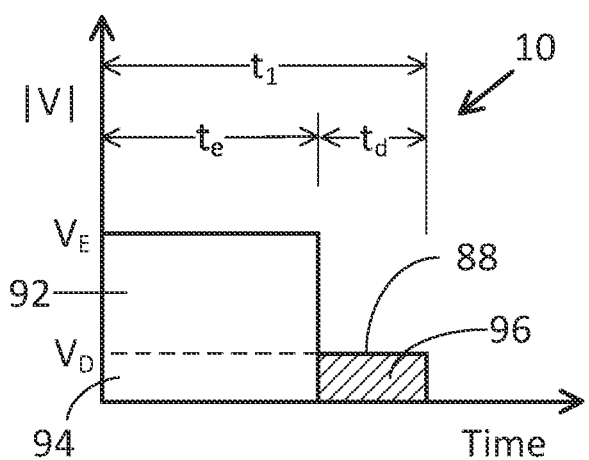
FIG. 2C illustrates by Cartesian plot features of the exemplary PET detector apparatus and PET detection system of FIG. 1.
Figure 2D:
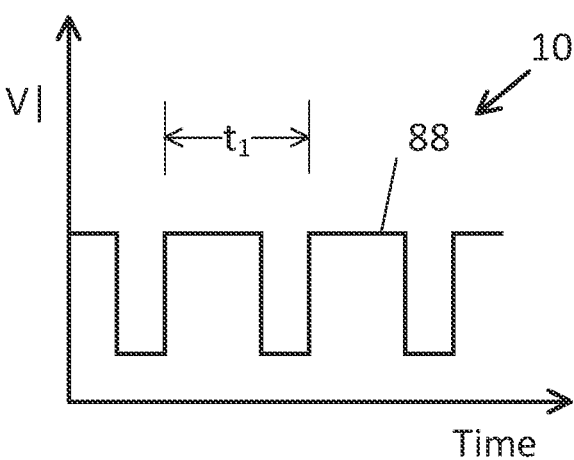
FIG. 2D illustrates by Cartesian plot features of the exemplary PET detector apparatus and PET detection system of FIG. 1.

Because PET 97 in cable 99 is comprised of pulse train 86 that is comprised of packets, such as packet 91, current i generated in input 20 is comprised of a corresponding pulse train 88 comprised of corresponding packets, such as corresponding packet 92 having corresponding period $t_1$ with corresponding fundamental frequency $f_1 = 1/t_1$, as illustrated in FIGS. 2C, 2D. Corresponding packet 92 is comprised of first subpacket 94 having first corresponding period $t_e$ and second subpacket 96 having second corresponding period $t_d$, as illustrated in FIG. 2C. First corresponding period $t_e$ of first subpacket 94 generally equals energy packet period $t_E$ of energy packet 93 and second corresponding period $t_d$ of second subpacket 96 generally equals data packet period $t_D$ of data packet 95 so that corresponding period $t_1$ of corresponding packet 92 generally equals packet period $t_P$ of packet 91, as illustrated in FIGS. 2A, 2C. First subpacket 94 has voltage $v_e$ and second subpacket 96 has voltage $v_d$ with voltage $v_d$ being smaller than voltage $v_e$ because voltage $v_e$ of first subpacket 94 and voltage $v_d$ of second subpacket 96 may correspond generally proportionally to voltage $v_E$ of energy packet 93 and voltage $v_D$ of data packet 95, respectively. In some implementations, voltage $v_d$ may be essentially zero, for example, when voltage $v_D$ of the data packet 95 is small or essentially zero (e.g., voltage $v_D$ of data packet 95 may be too small to generate detectible current i within input 20 of PET detector apparatus 12).

In addition to corresponding pulse train 88, current i may include other spurious waveforms (e.g., noise) that may be superimposed upon pulse train 86 in cable 99, and, thus upon corresponding pulse train 88, or may otherwise be coupled into current i. For example, these spurious waveforms may be coupled into current i from cable 99 and/or from AC currents being communicated in various pathways proximate cable 99. These spurious waveforms included in corresponding pulse train 88 may be at the primary electrical AC frequency (e.g., 60 Hz in the U.S.) and harmonics of the primary electrical AC frequency. High-pass filter 30 filters current i to remove spurious waveforms from current i such as frequency components of current i that correspond to the primary electrical AC frequency (e.g., 60 Hz) and harmonics of the primary electrical AC frequency. In various implementations, high pass filter 30 is implemented in hardware, and high-pass filter 30 is configured as a $5^{th}$ order Chebyshev high-pass filter with a low cut-off frequency of 500 Hz. High-pass filter 30 outputs signal 32 that comprises current i with frequency components below approximately 500 Hz generally eliminated, in this implementation. Signal 32 is communicated from high-pass filter 30 to anti-aliasing filter 40, as illustrated in FIG. 3.

Anti-aliasing filter 40 eliminates aliasing effects from signal 32 thereby forming signal 42, and signal 42 is then communicated from anti-aliasing filter 40 to A/D converter 50, as illustrated in FIG. 3. Aliasing occurs, for example, when different frequency components of signal 32 becoming indistinguishable from one another when digitized by A/D 50 and then processed by FFT 60. Anti-aliasing filter 40 eliminates frequency components of signal 32 above the Nyquist frequency of A/D converter 50, in this implementation. For example, anti-aliasing filter 40 is configured as an elliptic filter with an upper cut-off frequency of 1.8 kHz, so that frequency components above approximately 1.8 kHz are generally eliminated from signal 42. Anti-aliasing filter 40 is implemented in hardware, in certain implementations.

A/D converter 50 samples signal 42 to produce digital representation 52 of signal 42. Digital representation 52 is then communicated to FFT 60.

Figure 4:
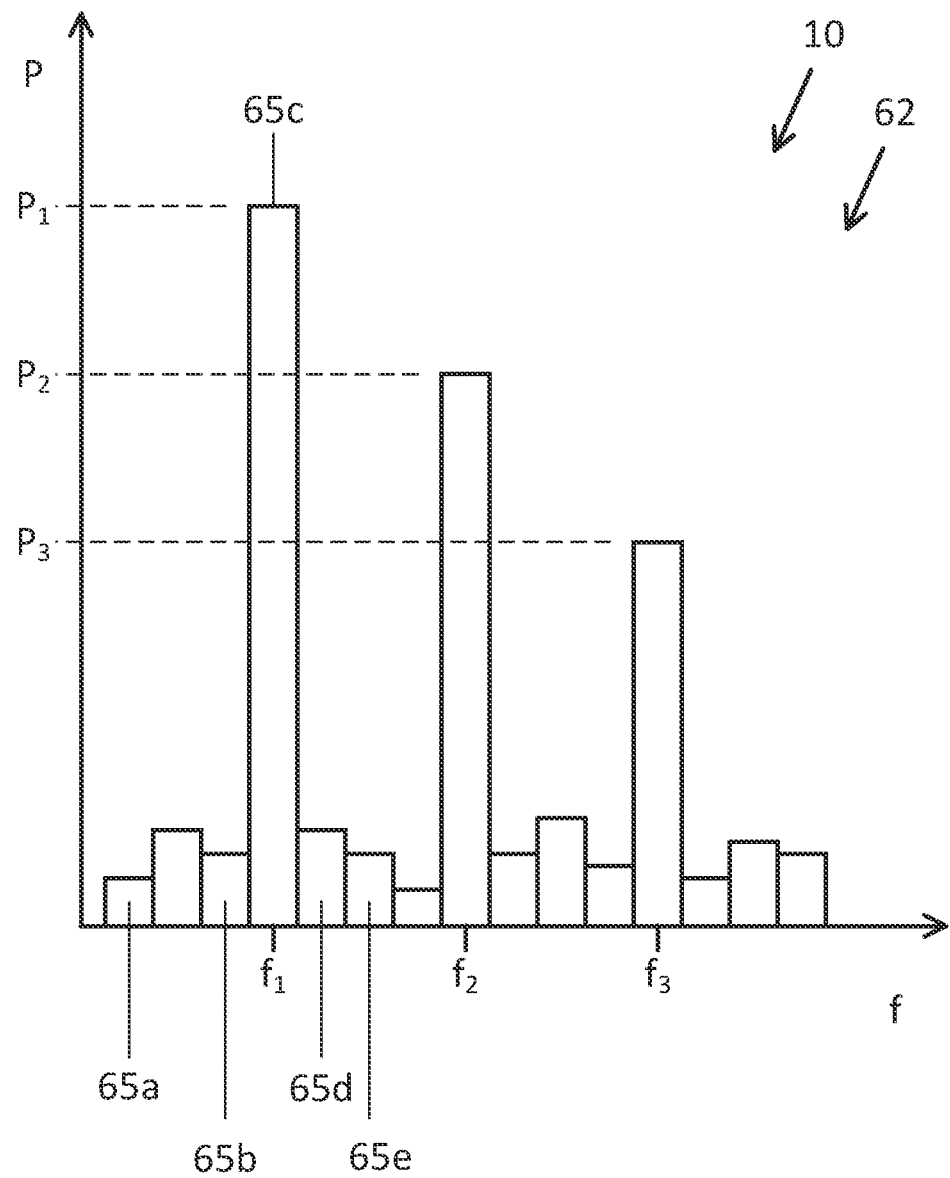
FIG. 4 illustrates by Cartesian plot an exemplary power spectrum from the FFT of the exemplary implementation of the PET detector apparatus and PET detection system of FIG. 1.

FFT 60 transforms digital representation 52 into power spectrum 62, which is illustrated in FIG. 4. Power spectrum 62 is illustrated in FIG. 4 as a plot of power P as a function of frequency f Note that exemplary power spectrum 62, as illustrated for explanatory purposes, has power maximum $P_1$ at fundamental frequency $f_1$ of corresponding pulse train 88 and power maxima $P_2$, $P_3$ at harmonic frequencies $f_2$, $f_3$ where harmonic frequencies $f_2$, $f_3$ are harmonics of fundamental frequency $f_1$. Spectral analyzer 70 analyzes the power spectrum 62 to find the occurrence of power maxima at a fundamental frequency, such as fundamental frequency $f_1$, and harmonics of the fundamental frequency, such as harmonic frequencies $f_2$, $f_3$, in order to detect the presence of PET 97. As illustrated in FIG. 4, for example, spectral analyzer 70 analyzes power spectrum 62 to find the occurrence of power maximum $P_1$ at fundamental frequency $f_1$ of corresponding pulse train 88 and power maxima $P_2$, $P_3$ at harmonic frequencies $f_2$, $f_3$ of fundamental frequency $f_1$ in order detect the presence of PET 97.

Note that the power maximum $P_1$ at fundamental frequency $f_1$ and power maxima $P_2$, $P_3$ at harmonic frequencies $f_2$, $f_3$ are local maxima. Also note that FIG. 4 is presented for explanatory purposes, so that power spectrum 62 may have any number of power maxima, such as power maxima $P_1$, $P_2$, $P_3$, at any number of frequencies, such as fundamental frequency $f_1$ and harmonic frequencies $f_2$, $f_3$. Spectral analyzer may analyze power spectrum 62 to find the occurrence of power maxima, such as power maxima $P_2$, $P_3$, at any number of harmonic frequencies, such as harmonic frequencies $f_2$, $f_3$, concurrent with power maximum $P_1$ at fundamental frequency $f_1$, in order detect the presence of PET 97 in cable 99.

When present, pulse train 86 of PET 97 in cable 99 generates corresponding pulse train 88 in PET detector apparatus 12 having fundamental frequency $f_1=1/t_P$, approximately. For example, an energy packet period of 1.1 ms and a data packet period of 0.4 ms results in a packet period $t_P$ of 1.5 ms so that both pulse train 86 and corresponding pulse train 88 have fundamental frequency $f_1$ of about 667 Hz, harmonic frequency $f_2$ of about 1333 Hz, and harmonic frequency $f_3$ of about 2000 Hz. Note that subscript 1 as in fundamental frequency $f_1$ refers to the fundamental frequency ($1^{st}$ harmonic), and subscripts 2, 3, 4, . . . of harmonic frequencies $f_2$, $f_3$, $f_4$, . . . refer to the $2^{nd}$ harmonic, $3^{rd}$ harmonic, $4^{th}$ harmonic, etc. of fundamental frequency $f_1$. In this example, spectrum 62 has power maxima at both even harmonics (e.g., 1333 Hz) and at odd harmonics (e.g., 2000 Hz) of the fundamental frequency (e.g., 667 Hz) because the duty cycle of pulse train 86 and, thus, the duty cycle of corresponding pulse train 88 is not 50% (e.g., $t_E \neq t_D$). Spectral analyzer 70 may then survey the fundamental frequency and both even harmonics and odd harmonics of the fundamental frequency for power maxima in order to detect PET, in various implementations. In this example, if power maxima $P_1$ is found at the fundamental frequency $f_1$ of about 667 Hz and if power maximum $P_2$ is found at harmonic frequency $f_2$ of about 1333 Hz, then PET 97 is detected. In this example, if there is no power maxima $P_1$ at the fundamental frequency $f_1$ of about 667 Hz or if there is no power maximum $P_2$ at the harmonic frequency $f_2$ of about 1333 Hz, then PET is not detected. In implementations of PET with a 50% duty cycle (e.g., $t_E=t_D$), power spectrum 62 has power maxima at the fundamental frequency and only at odd harmonics of the fundamental frequency, so that spectral analyzer 70 may survey the fundamental frequency $f_1$ and one or more odd harmonics (e.g., $f_3$, $f_5$, $f_7$, . . . ) of the fundamental frequency $f_1$ for power maxima in order to detect PET.

In various implementations, A/D converter 50 may be configured, at least in part, as a hardware portion of microcontroller 44, and FFT 60, and spectral analyzer 70 may be implemented in software operably received by processor 48 of microcontroller 44, as illustrated in FIG. 3. Note that microcontroller 44 may further include a clock, memory, peripherals, and so forth, and microcontroller 44 may support digital and analog I/O, as would be readily recognized by those of ordinary skill in the art upon study of this disclosure.

Microcontroller 44 communicates with display 80 to control operations of display 80, as illustrated in FIG. 3. Display 80 may indicate either the presence or absence of PET in cable 99 as determined by spectral analyzer 70.

In operation, probe 22 of PET detector apparatus 12 is placed in operative communication with cable 99 that is communicating electrical power by PET by placing housing extension 21 of housing 14 proximate cable 99. PET 97 in cable 99 configured as pulse train 86 generates current i in input 20 configured as corresponding pulse train 88, and corresponding pulse train 88 is communicated from input 20 to high-pass filter 30. High-pass filter 30 removes low frequency components from corresponding pulse train 88 thereby forming signal 32, and signal 32 is then communicated from high-pass filter 30 to anti-aliasing filter 40.

Anti-aliasing filter 40 eliminates frequency components of signal 32 above the Nyquist frequency of A/D converter 50 thereby forming signal 42, and signal 42 is then communicated from anti-aliasing filter 40 to A/D converter 50.

A/D converter 50 samples signal 42 to form digital representation 52 of signal 42. Digital representation 52 is then communicated to FFT 60. FFT 60 transforms digital representation 52 into power spectrum 62 illustrated in FIG. 4.

Spectral analyzer 70 then analyzes power spectrum 62 to find whether or not power maxima occur at a fundamental frequency of pulse train 86 and harmonics of the fundamental frequency of pulse train 86. The occurrence of power maximum $P_1$ at fundamental frequency $f_1$ concurrent with the occurrence of power maxima, such as power maxima $P_2$, $P_3$, at one or more harmonic frequencies, such as harmonic frequencies $f_2$, $f_3$, indicates PET 97 in cable 99. In some implementations, the occurrence of power maximum $P_1$ at fundamental frequency $f_1$ may be sufficient to indicate PET 97 in cable 99.

As illustrated in FIG. 4, power spectrum 62 may be divided into bins, such as bins 65a, 65b, 65c, 65d, 65e. The power of bin 65c may be compared with the power of nearby bins, such as bins 65a, 65b, 65d, 65e in order to find either the occurrence of power maximum $P_1$ at fundamental frequency $f_1$ or non-occurrence of power maximum $P_1$ at fundamental frequency as illustrated in FIG. 4. For example, if the power at bin 65c is greater than the power at bins 65a, 65b, 65d, 65e, as illustrated in FIG. 4, power maximum $P_1$ occurs at fundamental frequency $f_1$. When power maximum $P_1$ occurs, power maximum $P_1$ is a local maximum in power spectrum 62 because the power of bin 65c is greater than the power of bins 65a, 65b, 65d, 65e, in this illustrative implementation. Of course, the power of bin 65c may be compared with the power of any number of adjacent bins, such as bins 65a, 65b, 65d, 65e, in order to find the occurrence of power maximum $P_1$ at bin 65c depending upon the implementation. The occurrence of power maxima $P_2$, $P_3$ at harmonic frequencies $f_2$, $f_3$ may be found in a similar manner where power maxima $P_2$, $P_3$ are also local maxima.

Figure 5:
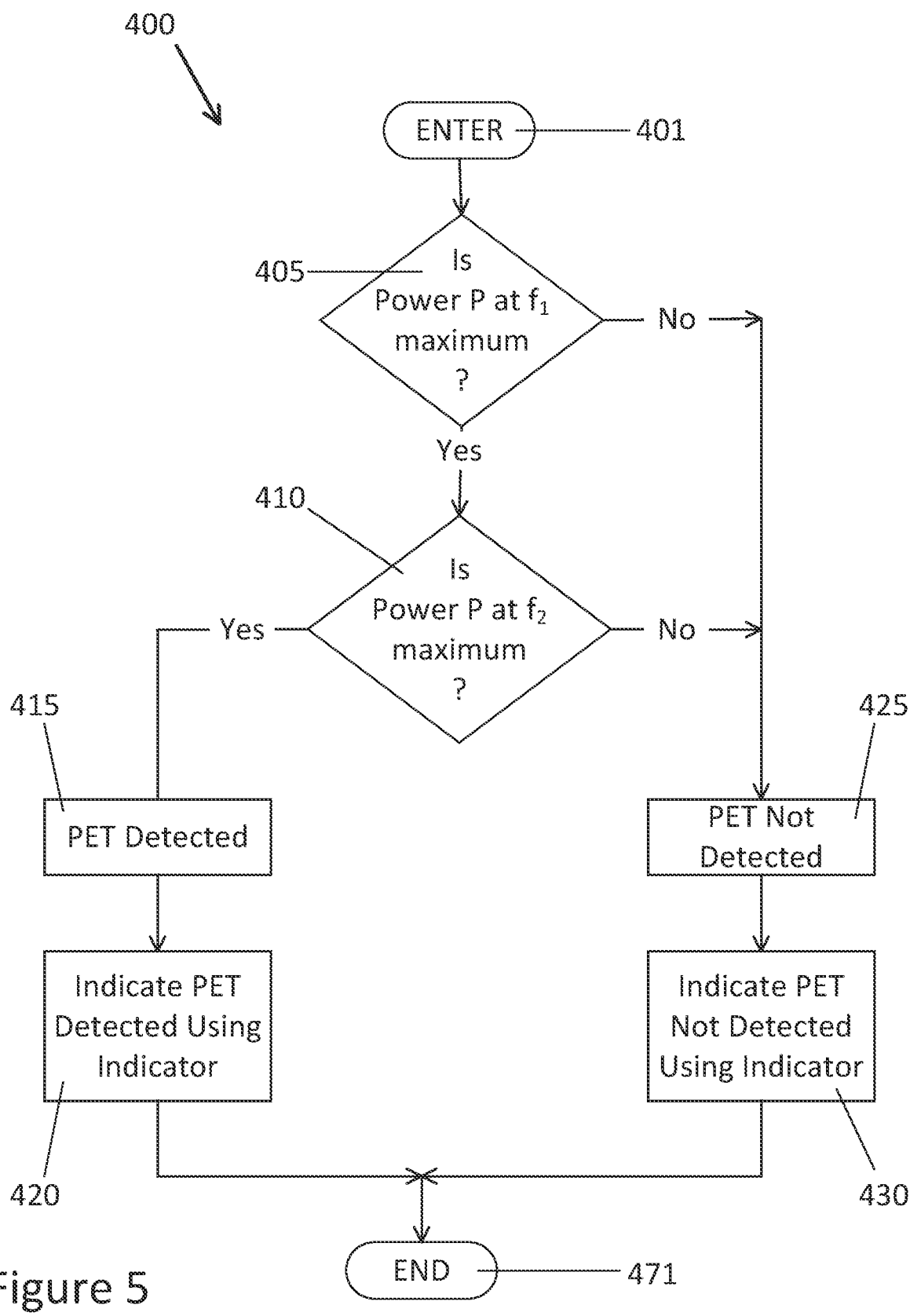
FIG. 5 illustrates by process flow chart portions of an exemplary method of operation of the exemplary PET detector apparatus and PET detection system of FIG. 1; and, FIG. 6 illustrates by process flow chart another exemplary method of operation of the exemplary PET detector apparatus and PET detection system of FIG. 1.

PET detector apparatus 12 may detect the presence of PET or absence of PET according to exemplary method 400 illustrated in FIG. 5. Method 400 may be implemented in software operably received by processor 48 of microcontroller 44. Method 400 is entered at step 401, as illustrated in FIG. 5, and method 400 proceeds from step 401 to step 405.

If local power maximum $P_1$ is found at fundamental frequency $f_1$ in power spectrum 62 at step 405, method 400 proceeds from step 405 to step 410. If local power maximum $P_2$ is found at harmonic frequency $f_2$ in power spectrum 62, method 400 proceeds from step 410 to step 415.

At step 415, PET is detected because local power maxima $P_1$, $P_2$ are found at fundamental frequency $f_1$ and at harmonic frequency $f_2$, respectively. Method 400 then proceeds from step 415 to step 420.

At step 420, display 80 is configured to indicate that PET is detected.

If no power maximum $P_1$ is found at fundamental frequency $f_1$ in power spectrum 62 or if no power maximum $P_2$ is found at harmonic frequency $f_2$ in power spectrum 62, method 400 proceeds from step 405 or from step 410, respectively, to step 425.

At step 425, PET is NOT detected because there is no power maximum $P_1$ in power spectrum 62 at fundamental frequency $f_1$, or because there is no power maximum $P_2$ in power spectrum 62 at harmonic frequency $f_2$. Method 400 then proceeds from step 425 to step 430. At step 430, display 80 is configured to indicate that PET is NOT detected.

Step 471 is then accessed either from step 420 or from step 430. Method 400 terminates at step 471.

Figure 6:
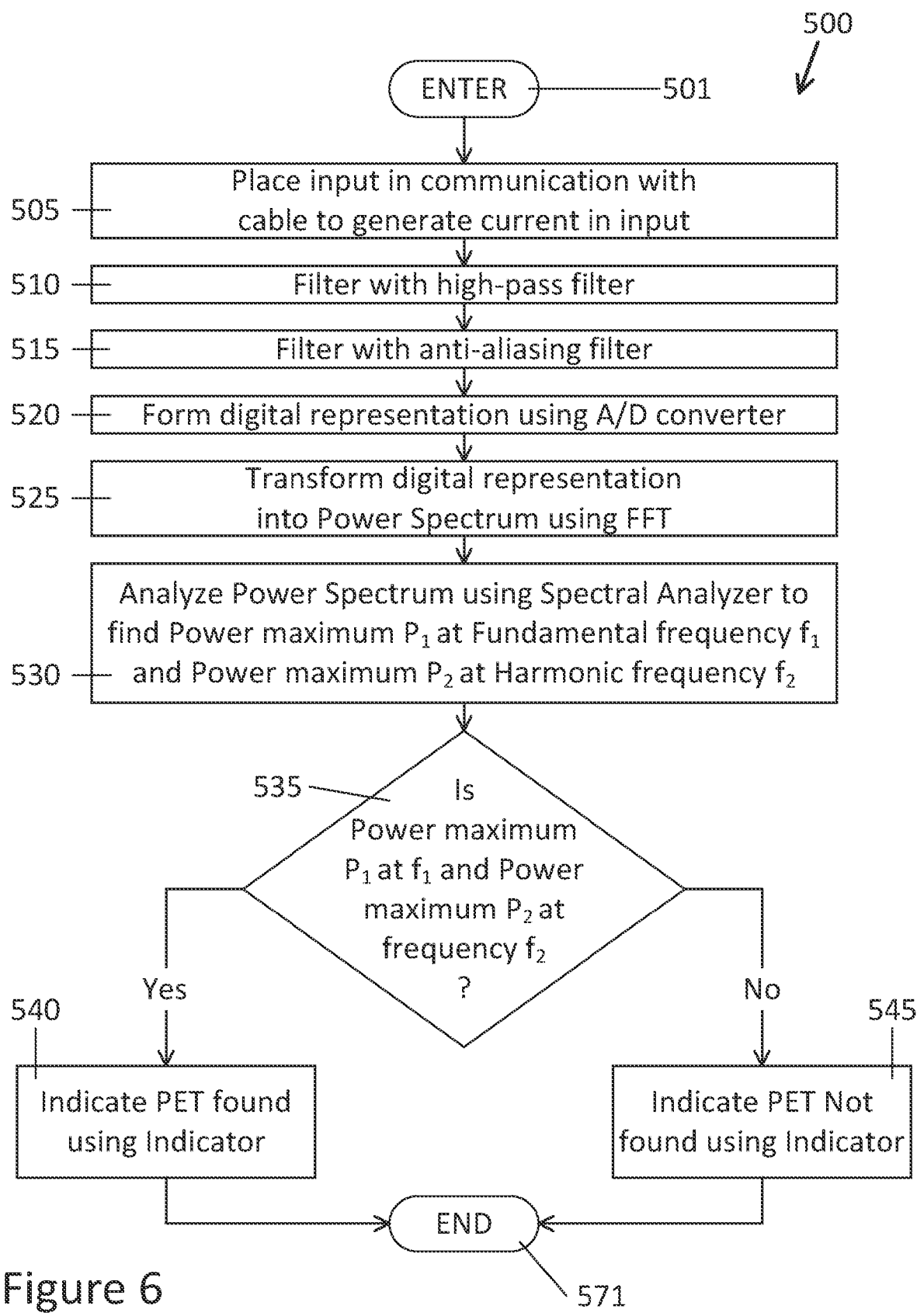

Another exemplary method 500 of detecting PET in cable 99 is illustrated in FIG. 6. Method 500 is entered at step 501 and proceeds from step 501 to step 505.

At step 505, current i configured as corresponding pulse train 88 is generated in input 20 of PET detector apparatus 12 by placing input 20 in operable communication with cable 99 that may be communicating PET 97. Method 500 then proceeds from step 505 to step 510.

At step 510, high-pass filter 30 filters corresponding pulse train 88. Method 500 the proceeds from step 510 to step 515.

At step 515, anti-aliasing filter 40 filters signal 32 output from high-pass filter 30. Method 500 the proceeds from step 515 to step 520.

At step 520, A/D converter 50 forms digital representation 52 of at least portions of signal 42 output from anti-aliasing filter 40. Method 500 the proceeds from step 520 to step 525.

At step 525, FFT 60 transforms digital representation 52 into power spectrum 62. Method 500 the proceeds from step 525 to step 530.

At step 530, spectral analyzer 70 analyzes power spectrum 62 to find if there is a power maximum $P_1$ in power spectrum 62 at fundamental frequency $f_1$ and to find if there is a power maximum $P_2$ in power spectrum 62 at harmonic frequency $f_2$. Method 500 then proceeds from step 530 to step 535.

At step 535, if local power maximum $P_1$ is found in power spectrum 62 at fundamental frequency $f_1$ AND local power maximum $P_2$ is found in power spectrum 62 at harmonic frequency $f_2$, method 500 proceeds from step 535 to step 540. At step 535, if local power maximum $P_1$ is NOT found in power spectrum 62 at fundamental frequency $f_1$ OR if local power maximum $P_2$ is NOT found in power spectrum 62 at harmonic frequency $f_2$, method 500 proceeds from step 535 to step 545.

At step 540, display 80 is configured to indicate that PET is detected because power maxima $P_1$, $P_2$ are found at fundamental frequency $f_1$ and harmonic frequency $f_2$, respectively.

At step 545, display 80 is configured to indicate that PET is NOT detected because there is no local power maximum $P_1$ in power spectrum 62 at fundamental frequency $f_1$, or because there is no local power maximum $P_2$ in power spectrum 62 at harmonic frequency $f_2$.

Step 571 is then accessed either from step 540 or from step 545. Method 500 terminates at step 571.

In certain implementations, no power maximum may be found in power spectrum 62 or only one power maximum may be found in power spectrum 62 thereby indicating no PET in cable 99 because there can be no match with both the fundamental frequency $f_1$ and with harmonic frequency $f_2$. In such implementations, display 80 indicates no PET. Some implementations may require finding of additional power maxima, e.g., $P_3$, $P_4$, $P_5$, $P_6$ . . . , at additional harmonic frequencies, e.g., $f_3$, $f_4$, $f_5$, $f_6$ . . . , in order to indicate that PET is detected in cable 99. Other implementations may require finding of additional power maxima, e.g., $P_3$, $P_5$, $P_7$, . . . , only at one or more odd harmonics (e.g., $f_3$, $f_5$, $f_7$, . . . ) of the fundamental frequency $f_1$ in order to detect PET. Yet other implementations may require finding only power maximum $P_1$ at fundamental frequency $f_1$ in order to indicate that PET is detected in cable 99.

While exemplary method 400 and exemplary method 500 are directed toward detecting power maximum $P_1$ at a specified fundamental frequency $f_1$, and power maximum $P_2$ at a specified harmonic frequency $f_2$, in other implementations power spectrum 62 may be scanned for power maxima and corresponding frequencies. The frequencies of the power maxima may then be matched to frequencies indicative of various configurations of PET. Certain implementations may be directed toward detecting power maxima at several specified fundamental frequencies and harmonic frequencies of the several fundamental frequencies in order to detect various configurations of PET. Some implementations may allow for user input and/or user selection of the fundamental frequency and harmonic frequency(ies). In other implementations the fundamental frequency and harmonic frequency(ies) may be pre-programmed into PET detector apparatus 12 and not user accessible. While the 4th and higher harmonic frequencies are generally omitted from this discussion, certain implementations of PET detection system 10 or PET detector apparatus 12 may detect power maxima at least at some of the 4th and higher harmonic frequencies in order to confirm the presence of PET in cable 99. Certain implementations of PET detection system 10 or PET detector apparatus 12 may detect power maxima and the fundamental frequency at odd harmonics of the fundamental frequency in order to detect configurations of PET having a 50% duty cycle. The presence of PET having other waveforms (e.g., ramp, triangular) may be detected, for example, by detecting power maxima in the power spectrum at fundamental frequency(ies) and harmonics of the fundamental frequency(ies) associated with the waveform.

The foregoing discussion along with the Figures discloses and describes various exemplary implementations. These implementations are not meant to limit the scope of coverage, but, instead, to assist in understanding the context of the language used in this specification and in the claims. The Abstract is presented to meet requirements of 37 C.F.R. §

The invention claimed is:

1. A PET detector apparatus for detecting PET in a cable, comprising:
   an input adapted to generate a current by operative communication of the input with said cable, and said cable communicating PET as a pulse train;
   an A/D converter in communication with the input to form a digital representation of at least portions of the current;
   an FFT to transform the digital representation into a power spectrum, the FFT in communication with the A/D converter; and
   a spectral analyzer to compare frequencies of maxima of the power spectrum with a fundamental frequency $f_1$ of the pulse train and a harmonic frequency $f_2$ of the pulse train to detect PET in said cable, the spectral analyzer in communication with the FFT.

2. The apparatus of claim 1, wherein a power maximum $P_1$ of the power spectrum occurs at the fundamental frequency $f_1$ and a second power maximum $P_2$ of the power spectrum occurs at the harmonic frequency $f_2$ to indicate PET in said cable.

3. The apparatus of claim 1, further comprising:
   a display to indicate detection of PET in said cable.

4. The apparatus of claim 1, wherein the current is generated by induction between said cable and the input.

5. The apparatus of claim 1, wherein the current is generated by capacitance between said cable and the input.

6. The apparatus of claim 1, further comprising:
   a high-pass filter operably interposed between the input and the A/D converter to remove signals having a frequency below a low cut-off frequency from the current.

7. The apparatus of claim 1, further comprising:
   an anti-aliasing filter operably interposed between the input and the A/D converter to remove signals having a frequency above an upper cut-off frequency from the current.

8. The apparatus of claim 1, further comprising:
   a microcontroller that comprises the A/D converter and a processor, the FFT and the spectral analyzer being implemented at least in part as software operably received by the processer.

9. A system for detecting PET, comprising:
   a cable communicating a PET as a pulse train;
   an input in operative communication with the cable to generate a current from the PET;
   an A/D converter in communication with the input to form a digital representation of at least portions of the current;
   an FFT to transform the digital representation into a power spectrum, the FFT in communication with the A/D converter; and
   a spectral analyzer to compare frequencies of maxima of the power spectrum with fundamental frequency $f_1$ of the pulse train and harmonic frequency $f_2$ of the pulse train of the PET to detect PET in the cable, the spectral analyzer in communication with the FFT.

10. The system of claim 9, wherein a power maximum $P_1$ of the power spectrum occurs at fundamental frequency $f_1$ of the pulse train and a second power maximum $P_2$ occurs at a harmonic frequency $f_2$ of the pulse train to indicate PET in said cable.

11. The system of claim 9, further comprising:
    a display to indicate detection of PET in said cable.

12. The system of claim 9, wherein the current is generated by induction between the said cable and the input.

13. The system of claim 9, wherein the current is generated by capacitance between said cable and the input.

14. The system of claim 9, further comprising:
    a high-pass filter operably interposed between the input and the A/D converter to remove signals having a frequency below a low cut-off frequency from the current.

15. The system of claim 9, further comprising:
    an anti-aliasing filter operably interposed between the input and the A/D converter to remove signals having a frequency above an upper cut-off frequency from the current.

16. A method of detecting PET in a cable, comprising the steps of:
    generating a current in an input of a PET detector apparatus by placing the input in operable communication with said cable, said cable communicating PET configured as a pulse train having a fundamental frequency $f_1$ and a harmonic frequency $f_2$;
    forming a digital representation of at least portions of the current using an A/D converter communicating with the input;
    transforming the digital representation into a power spectrum using an FFT, the FFT communicating with the A/D converter; and
    detecting PET in said cable by finding a power maximum $P_1$ at the fundamental frequency $f_1$ and finding a power maximum $P_2$ at the harmonic frequency $f_2$.

17. The method of claim 16, further comprising the step of:
    indicating detecting PET in said cable using a display following the step of detecting PET in said cable by finding a power maximum $P_1$ at the fundamental frequency $f_1$ and finding a power maximum $P_2$ at the harmonic frequency $f_2$.

18. The method of claim 16, further comprising the step of:
    filtering the current prior to the step of forming a digital representation of at least portions of the current using an A/D converter.

19. The method of claim 16, wherein the current is generated by induction or by capacitance between said cable and the input.

20. The method of claim 16, further comprising the step of:
    detecting no PET in said cable by either not finding the power maximum $P_1$ at the fundamental frequency $f_1$ or not finding the power maximum $P_2$ at the harmonic frequency $f_2$.

* * * * *